United States Patent [19]
Ishihara

[11] Patent Number: 5,166,559
[45] Date of Patent: Nov. 24, 1992

[54] SERVO CIRCUIT HAVING VARIABLE GAIN AMPLIFIER AND TEMPERATURE COMPENSATION CHARACTERISTICS

[75] Inventor: Masaaki Ishihara, Kanagawa, Japan
[73] Assignee: Sony Corporation, Tokyo, Japan
[21] Appl. No.: 748,047
[22] Filed: Aug. 21, 1991

[30] Foreign Application Priority Data

Aug. 24, 1990 [JP] Japan .................................. 2-223560
Sep. 6, 1990 [JP] Japan .................................. 2-236389
Sep. 6, 1990 [JP] Japan .................................. 2-236390

[51] Int. Cl.$^5$ .......................... H03F 1/30; G06G 7/12
[52] U.S. Cl. .................... 307/491; 307/493; 307/264; 330/289
[58] Field of Search ............. 307/493, 491, 264, 310; 330/289, 279, 139, 136

[56] References Cited

U.S. PATENT DOCUMENTS

| | | | |
|---|---|---|---|
| 3,770,984 | 11/1973 | Connor et al. | 330/139 |
| 4,101,841 | 7/1978 | Okada et al. | |
| 4,234,853 | 11/1980 | Yamaguchi | 330/279 |
| 4,238,738 | 12/1980 | Komori | 330/289 |
| 4,546,326 | 10/1985 | Van Uffelen et al. | 330/279 |
| 5,030,924 | 7/1991 | Fritz | 330/289 |

OTHER PUBLICATIONS

Patent Abstracts of Japan, vol. 12, No. 3, Publication No. 62 165,415 (Nakayama).
Patent Abstracts of Japan, vol. 8, No. 221, Publication No. 59 104826 (Iwase).
Patent Abstracts of Japan, vol. 6, No. 123, Publication No. 57 052239.

Primary Examiner—Janice A. Howell
Assistant Examiner—Toan Tran
Attorney, Agent, or Firm—Lewis H. Eslinger; Jay H. Maioli

[57] ABSTRACT

A servo circuit adapted for controlling a variable gain amplifier to process an audio signal in a television receiver, a stereo apparatus or the like. The servo circuit comprises a variable gain amplifier so formed that the gain thereof is variable with a predetermined temperature coefficient to an absolute temperature, an amplitude limiter for setting upper and lower limits of the gain variable range of the amplifier, a gain control range determiner for changing the upper and lower limits of the gain variable range in the amplitude limiter with a temperature coefficient inverse in polarity to that of the amplifier, and a signal processor for detecting and calculating the level of a process signal supplied to one input terminal and the level of a control signal supplied to the other input terminal, and then outputting a gain control signal in accordance with the level difference between the two input signals so as to control the gain of the variable gain amplifier. When the servo circuit is formed into an IC configuration, a high-precision operating characteristic is attained merely by a bipolar-transistor manufacturing process to consequently minimize the number of required process steps, hence curtailing the production cost.

10 Claims, 8 Drawing Sheets

SERVO CIRCUIT HAVING VARIABLE GAIN AMPLIFIER AND TEMPERATURE COMPENSATION CHARACTERISTICS

BACKGROUND OF THE INVENTION

1. Field of the Invention

The present invention relates to a servo circuit and, more particularly, to a means for controlling a variable gain amplifier to process an audio signal in a television receiver, a stereo apparatus or the like.

2. Description of the Prior Art

There is known a servo circuit for controlling the gain in a signal, which is to be processed, by changing a control voltage or current supplied to a variable gain amplifier (hereinafter referred to as VCA) to vary the gain of such amplifier. Servo circuits are classified into a closed loop type and an open loop type, and a variety of methods and circuit configurations are presently contrived for controlling a VCA. However, in forming such a servo circuit into an IC (integrated circuit) configuration, there exist some disadvantages due to nonuniformity of the temperature characteristic or specific characteristics inherent in a bipolar-transistor IC. According to the known methods, a temperature characteristic canceler is inserted in a VCA control path to improve the temperature characteristic of an entire servo circuit, or a switch means is inserted for halting the VCA gain variation in a certain state so as not to cause any gain change in the VCA despite any level change of the control signal level.

In the conventional servo circuit, if the VCA control characteristics or the upper and lower limits of the control voltage or current have a temperature characteristic, it follows that the gain control range of the servo circuit as a whole will have a temperature characteristic.

Figure 1:
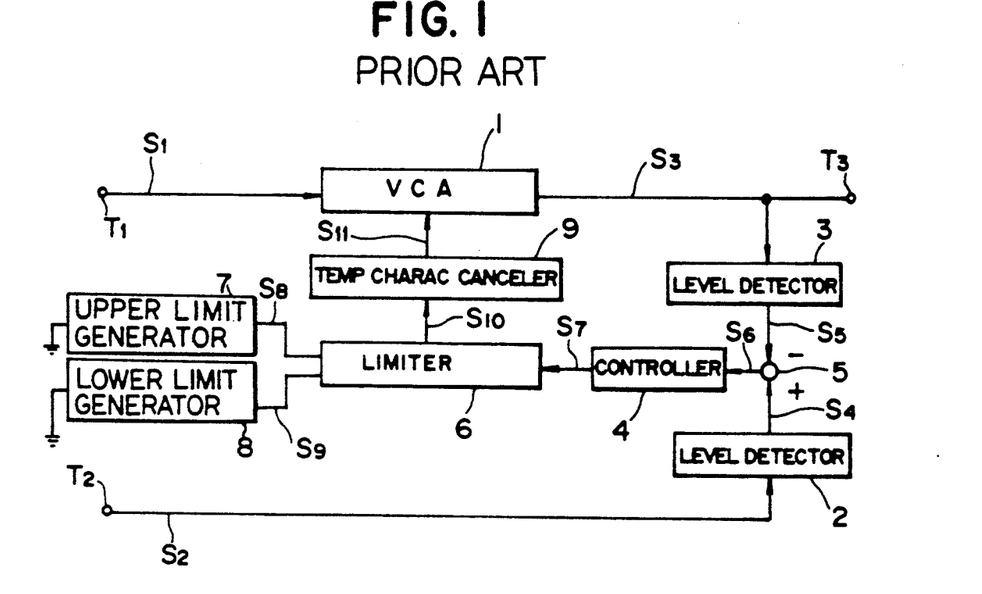
FIG. 1 is a block diagram of a conventional closed-loop servo circuit with a temperature characteristic canceler employed in a feedback circuit.

FIG. 1 is an exemplary block diagram of a conventional closed-loop servo circuit. In this diagram, a process signal S1 fed to a process signal input terminal T1 is supplied to a VCA 1, and a control signal S2 fed to a control signal input terminal T2 is supplied to a first level detector 2. Meanwhile a VCA output signal S3 is delivered to an output terminal T3 and then is supplied to a second level detector 3. Output signals S4 and S5 of such first and second level detectors 2, 3 are added to each other by an adder 5 with the polarities thereof rendered mutually inverse. An output S6 of the adder 5 is delivered to a controller 4, which produces a control signal S7 for controlling the gain of the VCA 1 in accordance with the polarity of the adder output 6 and then delivers the signal S7 to a limiter 6. For example, when the level detection outputs S4 and S5 of the polarities shown are supplied to the adder 5, a control signal S7 for increasing the gain of the VCA 1 is outputted from the controller 4 in the case where the adder output S6 is positive, whereby the gain of the VCA 1 is increased so that, of the two signals supplied to the adder 5, the negative signal S5 is gradually rendered greater, and the servo action is completed upon arrival of the adder output S6 at zero.

The limiter 6 is supplied with an upper limit setting signal S8 from an upper limit generator 7 and also with a lower limit setting signal S9 from a lower limit generator 8, and serves to change its output signal S10 between the upper and lower limit values.

The output signal S10 from the limiter 6 is supplied to a temperature characteristic canceler 9 provided for canceling the temperature characteristic included in the control characteristics of the VCA 1. The signal S10 obtained from the limiter 6 is outputted as a gain control signal S11 from the temperature characteristic canceler 9 and then is delivered to the VCA 1.

Figure 2:
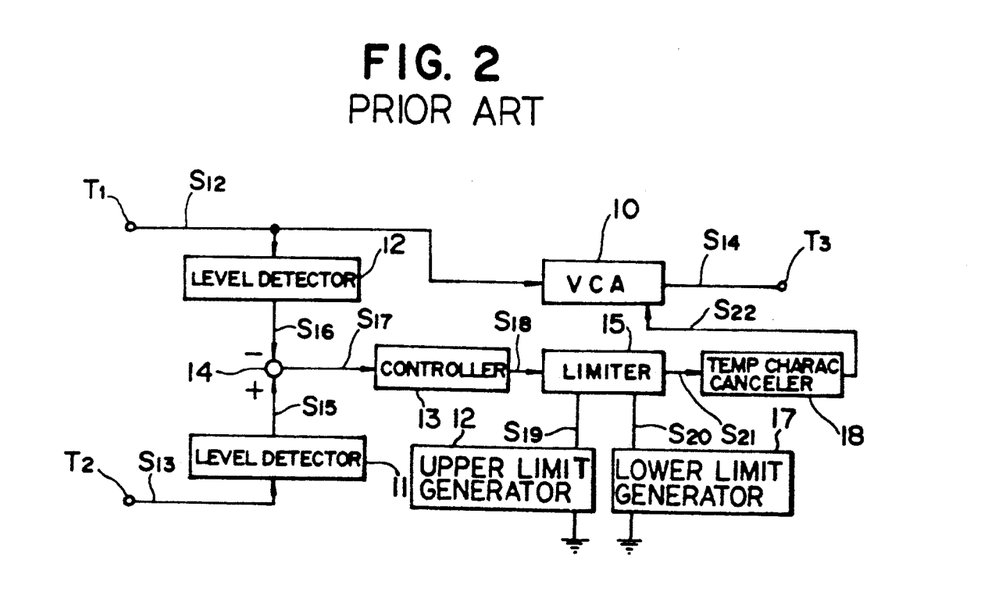
FIG. 2 is a block diagram of a conventional open-loop servo circuit with a temperature characteristic canceler.

In addition to FIG. 1 representing an exemplary case where the servo circuit is formed into a closed loop, a similar operation is performed also in the case of FIG. 2 where the servo circuit is formed into an open loop.

In the conventional servo circuit of the configuration mentioned, it is necessary to insert a canceler 9 for canceling the temperature characteristic included in the control characteristics of the VCA 1 as described, hence enlarging the circuit scale while increasing the power consumption and the production cost as well.

Since it is not desired that the signals S8 and S9 outputted respectively from the upper limit generator 7 and the lower limit generator 8 have a temperature characteristic, a constant voltage circuit (or constant current circuit) is required to cancel the temperature characteristic of the upper limit setting signal S8 and the lower limit setting signal S9. However, the provision of such a canceler circuit renders the entire servo circuit configuration further complicated. Although the circuit configuration may be simplified by the use of a limiter 6 with a diode, zener diode or similar element, any limiter with such an element has a temperature characteristic and therefore some disadvantages are induced inclusive of nonuniform operation and characteristic variations due to temperature fluctuations.

Now a description will be given on another conventional example where gain variation is reduced by the use of a switch circuit in a feedback path of a closed-loop servo circuit.

Figure 3:
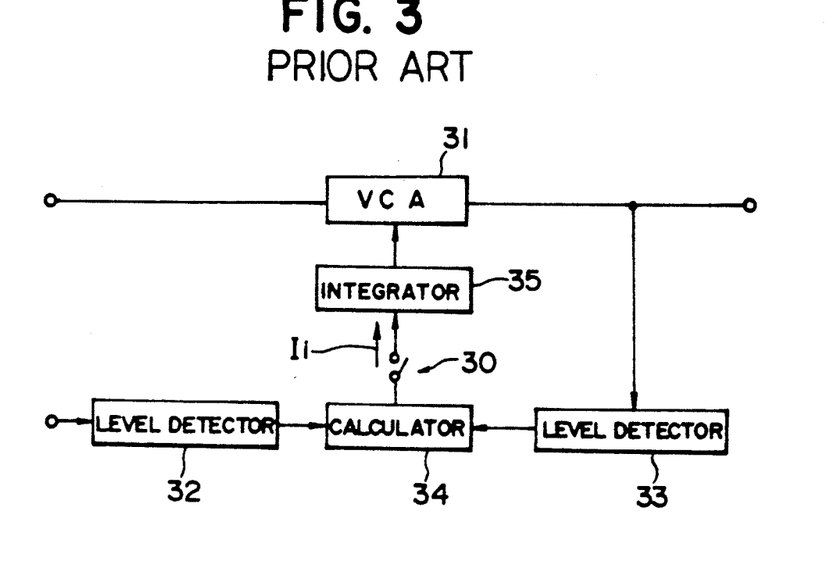
FIG. 3 is a block diagram of another conventional closed-loop servo circuit with a switch means employed in its closed loop.

As shown in a block diagram of FIG. 3, there is known a servo circuit for controlling the gain of a VCA by an output voltage of an integrator. In such a servo circuit, both the level of an input signal to be processed and the level of a control signal are detected and calculated, and then the voltage held by the integrator is changed in accordance with the result of such calculation to change the output voltage, thereby controlling the gain of the VCA.

During such gain control action, it is occasionally needed to execute an operation of halting the VCA gain variation so as not to cause any gain change in the VCA despite any change of the control signal level. Such gain control can be achieved by interrupting the current flowing in the integrator. More specifically, when the input current to the integrator is interrupted, the integrator holds the voltage at such instant, so that the control voltage for the VCA is maintained at a fixed value to thereby retain the gain of the VCA at a certain fixed value.

FIG. 3 is a block diagram of an exemplary servo circuit based on the prior art. In this diagram, there are included a VCA 31, a first level detector 32, a second level detector 33, a calculator 34, an integrator 35, and a switch 30. The switch 30 is provided for interrupting an input current flowing into the integrator 35. It has been generally customary in the conventional servo circuit to employ a MOS FET or a junction FET as the switch 30.

Therefore, in manufacturing the servo circuit of FIG. 3 by a bipolar production process, an additional step of forming a FET for the switch 30 is required which consequently raises the production cost. For the purpose of averting such increase in the production cost, there may be contrived an improvement where, as shown in a circuit diagram of FIG. 4, a bipolar transistor Q1 is interposed between the calculator 34 and the integrator 35 to constitute the switch 30. In this case, it becomes possible to eliminate the necessity of adding the FET forming process for the switch 30, hence solving the problem of an increase in the production cost that is derived from the additional process step. However, there occurs an operational inconvenience as will be described below. In an exemplary circuit configuration where the output of a calculator is provided in the form of a voltage, if the voltages at individual portions are such as those shown in FIG. 4, the output current $I_i$ obtained in the absence of a switch 36 is expressed as $$\text{Input current } I_i = (V1 - V2) / R1 \quad (1)$$

Figure 4:
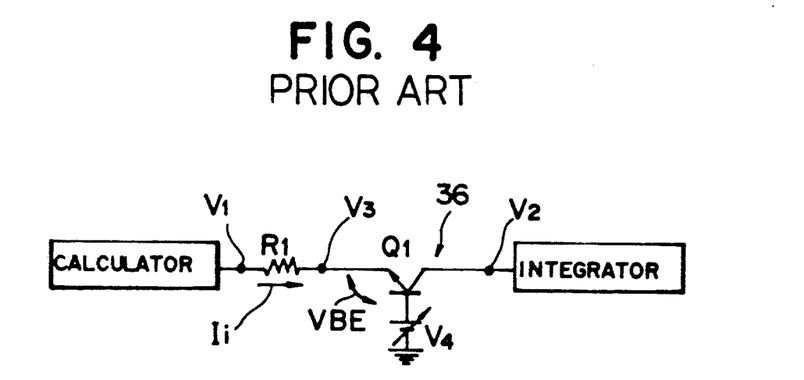
FIG. 4 is a switch circuit diagram where the switch means employed in the closed-loop servo circuit of FIG. 3 is composed of a bipolar transistor.

Therefore the input current $I_i$ comes to have a value determined at the input terminal of the integrator 35.

When the bipolar transistor Q1 in the circuit of FIG. 4 is turned on, the input current $I_i$ comes to flow in the resistor R1 in accordance with the potential difference across the resistor R1. It is expressed as $$\text{Input current } I_i = (V1 - V3) / R1 \quad (2)$$

The voltage V3 is rendered lower than the control voltage V4 by a value corresponding to the base-emitter voltage $V_{BE}$. However, since the base-emitter voltage $V_{BE}$ changes depending on the input current $I_i$ or the temperature, it follows that the voltage V3 also varies correspondingly thereto. Accordingly the input current $I_i$ changes in conformity with the temperature fluctuation and so forth, and the current inputted practically to the integrator 35 fails to be accurately proportional to the output voltage V1 of the calculator 34, hence inducing a disadvantage in that the precision is deteriorated when the bipolar transistor Q1 is used as the switch 30.

OBJECTS AND SUMMARY OF THE INVENTION

It is a first object of the present invention to provide a servo circuit comprising a variable gain amplifier (VCA), an amplitude limiter for setting an upper limit and a lower limit of a range in which the gain of the VCA is variable, and a gain control means so contrived that the temperature coefficient of the VCA and the temperature coefficients of the upper and lower limits of the gain variable range in the amplitude limiter are rendered mutually inverse in polarity, thereby canceling the temperature characteristic in the gain variable range to consequently eliminate the temperature characteristic in a simplified circuit configuration.

A second object of the present invention is to provide a closed-loop servo circuit employing a limiter.

A third object of the invention resides in providing an open-loop servo circuit employing a limiter.

A fourth object of the invention is to provide a circuit for generating a voltage to determine the aforementioned gain control range.

A fifth object of the invention is to provide a closed-loop servo circuit with a switch means.

A sixth object of the invention resides in providing an open-loop servo circuit with a switch means.

A seventh object of the invention is to provide a switch means and a specific circuit thereof adapted for use in both a closed-loop servo circuit and an open-loop servo circuit.

An eighth object of the invention resides in providing another switch means and a specific circuit thereof adapted for use in both a closed-loop servo circuit and an open-loop servo circuit.

And a ninth object of the invention is to provide a servo circuit incorporated practically in a stereophonic audio apparatus.

According to one aspect of the present invention, there is provided a servo circuit which comprises a variable gain amplifier where the gain is variable with a predetermined temperature coefficient relative to an absolute temperature, an amplitude limiter for setting an upper limit and a lower limit of the gain variable range of the amplifier, and a gain control range determiner for changing the upper and lower limits of the gain variable range in the amplitude limiter with a temperature coefficient inverse in polarity to that of the amplifier.

According to another aspect of the present invention, there is provided a servo circuit which further comprises a signal processor for detecting and calculating the level of a control signal supplied to one input terminal and the level of a process signal supplied to the other input terminal, and outputting a gain control signal in accordance with the level difference between the two input signals so as to control the gain of the variable gain amplifier.

The above and other features and advantages of the present invention will become apparent from the following description which will be given with reference to the illustrative accompanying drawings.

DESCRIPTION OF THE PREFERRED EMBODIMENTS

Hereinafter some preferred embodiments of the present invention will be described in detail with reference to the accompanying drawings.

Figure 5:
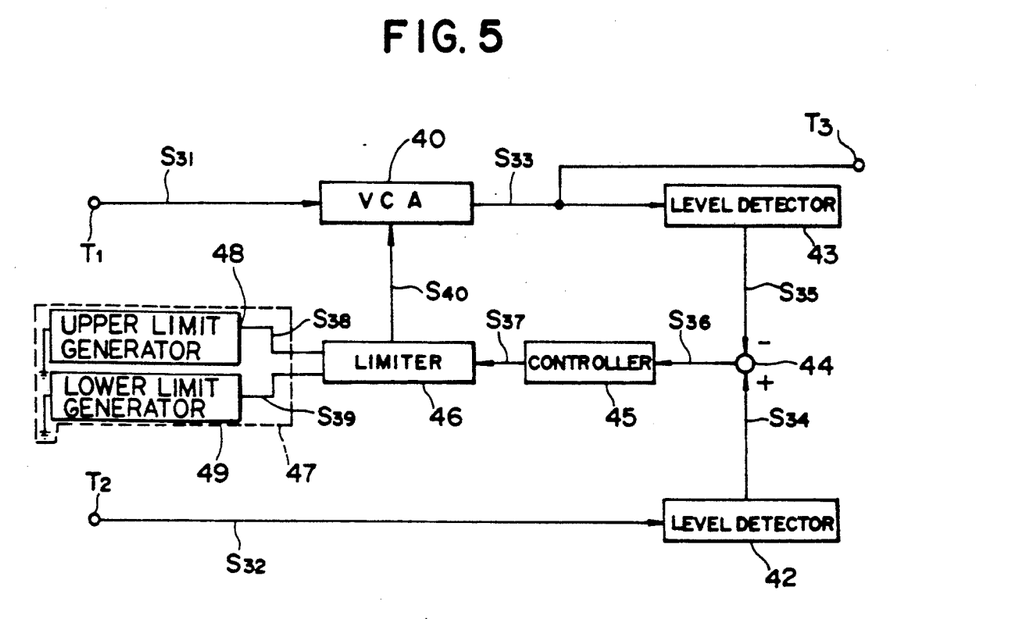
FIG. 5 is a block diagram of a first embodiment of the present invention representing a closed-loop servo circuit with a limiter employed for control of a VCA.

FIG. 5 is a block diagram of a closed-loop servo circuit according to a first embodiment of the present invention.

As obvious from this diagram, the first embodiment is approximately similar to the aforementioned conventional servo circuit of FIG. 1 with regard to the circuit configuration as a whole. More specifically, a process signal S31 fed to a process signal input terminal T1 is supplied to a VCA 40, and a control signal S32 fed to a control signal input terminal T2 is supplied to a first level detector 42. In the meantime, the VCA output S33 is delivered to an output terminal T3 while being supplied to a second level detector 43. And respective output signals S34 and S35 of the first and second level detectors 42, 43 are added to each other by an adder 44 in such a manner that the polarities thereof are rendered mutually inverse. Thereafter an output S36 of the adder 44 is delivered to a controller 45.

The controller 45 produces a control signal S37 for controlling the gain of the VCA 40 in accordance with the polarity of the input signal and then delivers the signal S37 to a limiter 46. For example, when the level detection outputs S34 and S35 of the polarities shown are supplied to the adder 44, a control signal S37 for increasing the gain of the VCA 40 is outputted from the controller 45 in the case where the adder output S36 is positive, whereby the gain of the VCA 40 is increased so that, in of the two signals supplied to the adder 44, the negative signal is gradually rendered greater, and the servo action is completed upon arrival of the adder output S36 at zero.

The limiter 46 is supplied with an upper limit setting signal S38 from an upper limit generator 48 in a gain control range determiner 47 and also with a lower limit setting signal S39 from a lower limit generator 49, and serves to change its output signal S40, which corresponds to the gain control signal S11 in FIG. 1, between such upper and lower limit values.

The output signal S40 from the limiter 46 is supplied as a gain control signal to the VCA 40, which then performs an operation of varying the gain within the range determined by the gain control range determiner 47.

Figure 6:
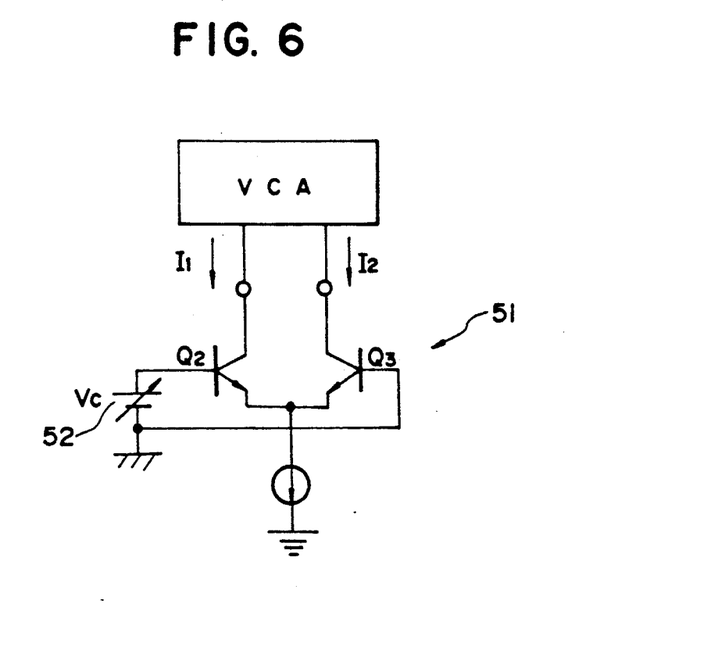
FIG. 6 is a circuit diagram of a differential amplifier for explaining the gain control method executed in the first embodiment of the present invention shown in FIG. 5.

The gain control in the VCA 40 is generally executed by, as shown in FIG. 6, changing the ratio of the output currents, which flow in transistors Q2 and Q3 of a differential amplifier 51 respectively, by means of a control voltage adjuster 52 to thereby change the operating state of the circuit.

In the circuit for controlling the gain in the manner described, the ratio of the output currents $I_1$ and $I_2$ of the transistors Q2 and Q3 is expressed as follows in relation to the control voltage Vc of the control voltage adjuster 52.

$$I_1/I_2 = \exp(q\ Vc/\ kT) \quad (1)$$

Generally the circuit is so formed as to keep the gain of the VCA 40 proportional to the ratio $I_1/I_2$ Therefore, in relation to a proportion constant $a$, the gain A of the VCA 40 is expressed as $$A = a \cdot \exp(q\ Vc\ kT) \quad (2)$$

Accordingly it is found that the logarithmic gain of the VCA shown in FIG. 6 is inversely proportional to the absolute temperature T.

Figure 7:
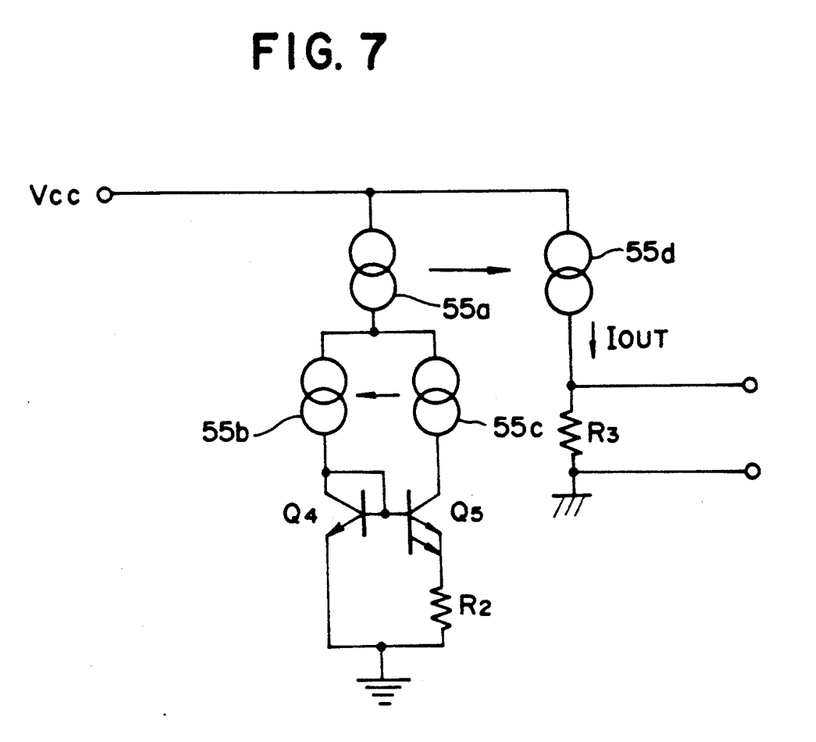
FIG. 7 is a circuit diagram of a means for generating a voltage to determine the control range shown in the first embodiment of FIG. 5.

Meanwhile the means for generating a voltage directly proportional to the absolute temperature T may be such as shown in a circuit diagram of FIG. 7 which is considered adequate to realize an IC configuration. FIG. 7 represents an exemplary current mirror circuit comprising first through fourth constant current sources 55a, 55b, 55c, 55d; first and second transistors Q4, Q5; a resistor R2 connected between the emitter of the transistor Q5 and the ground; and a resistor R3 connected between the constant current source 55d and the ground. The output voltage of such current mirror circuit is obtained across the resistor R3.

In the circuit of FIG. 7, the output current $I_{out}$ flowing in the resistor R3 is expressed as follows in relation to the ratio 1 : n between the emitter area of the transistor Q4 and that of the transistor Q5.

$$I_{out} = \{(2kT/q) \cdot \ln n\ \}/R2 \quad (3)$$

Therefore the upper or lower limit $V_{LIMIT}$ of the control voltage obtained from the resistor R3 is given by $$V_{LIMIT} = (R3/\ R2)\ (2kT\ /\ q) \cdot \ln n \quad (4)$$

Thus, the output voltage $V_{LIMIT}$ is in direct proportion to the absolute temperature T. Consequently, under the conditions that the circuit of FIG. 7 is used for both the upper limit generator 48 and the lower limit generator 49 in FIG. 5, if the voltages $V_{LIMIT}$ outputted from such limit generators are utilized as upper and lower limit values of the control voltage for the VCA 40, then the temperature characteristics in the gain control range of the entire servo circuit cancel each other to become zero. Accordingly, an improved servo circuit free from a temperature characteristic in the gain control range can be accomplished by the present invention with a simplified circuit configuration. In the exemplary circuit of FIG. 5, the output signal of the VCA 40 is inputted directly to the level detector 43. However, the circuit configuration may be so modified as to execute some signal processing before supplying the VCA output signal to the level detector 43. Furthermore the characteristics of the controller 45 and the level detectors 42, 43 can be set freely.

Figure 8:
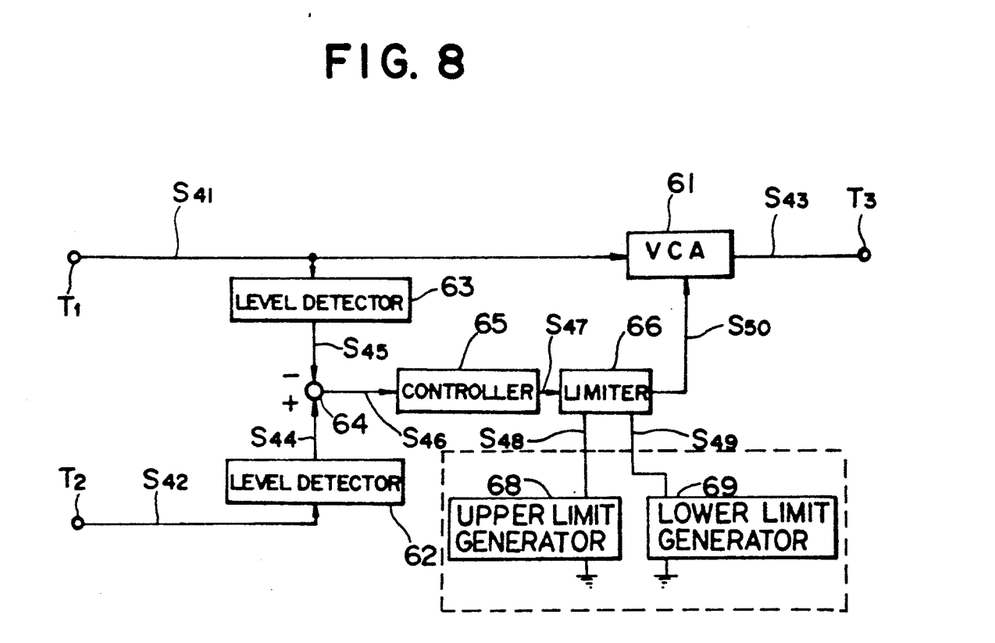
FIG. 8 is a block diagram of a second embodiment of the present invention representing an open-loop servo circuit with a limiter.

The servo circuit of the present invention is properly applicable also to an open-loop type as shown in a circuit block diagram of FIG. 8.

Although in the above embodiment each of the upper limit setting signal S48 and the lower limit setting signal S49 is supplied in the form of a voltage to the limiter 66, such signals S48 and S49 may be provided in the form of a current as well. In the latter case where the current signals are supplied, the output current $I_{OUT}$ in FIG. 7 may be directly taken out and fed to the limiter 66.

When the servo circuit according to the above embodiment is formed into an IC configuration, the existing means for generating a voltage (or current) directly proportional to the temperature as shown in FIG. 7 is utilizable since it is generally incorporated in an IC, and therefore the servo circuit can be constituted free from a temperature characteristic without causing any substantial enlargement of the circuit scale.

As described hereinabove, the present invention is so contrived that the temperature coefficient of the VCA and that of the amplitude limiter for setting upper and lower limits of the gain variable range in the VCA are rendered mutually inverse in polarity, so that if the characteristic of the VCA and the temperature characteristic within the gain variable range preset by the amplitude limiter are changed due to temperature fluctuations, such changes cancel each other to consequently reduce to zero the temperature characteristic in the gain control range of the entire servo circuit. Thus it becomes possible to eliminate the necessity of the known circuit employed customarily to cancel the temperature characteristic in the gain control range, hence simplifying the servo circuit configuration which is free from the temperature characteristic in the gain control range. Furthermore, since such simplification of the circuit configuration is not based on the use of an element such as a zener diode or the like in the control voltage limiter for the VCA, it is possible to prevent the occurrence of any characteristic fluctuation that may otherwise be derived from nonuniformity of the temperature coefficients of such elements.

Figure 9:
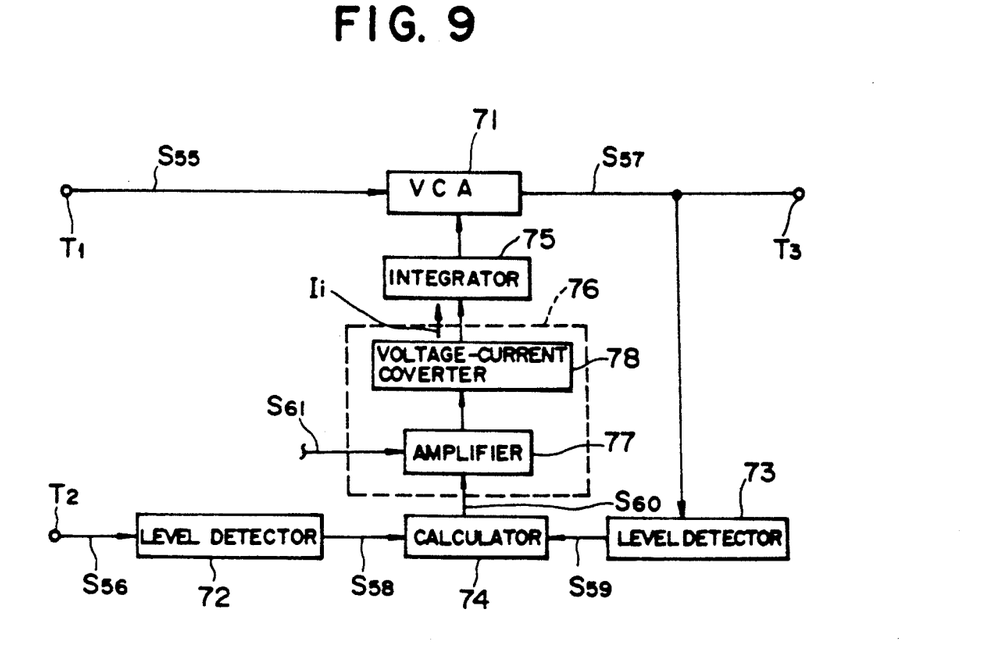
FIG. 9 is a block diagram of a third embodiment of the present invention representing a closed-loop servo circuit with a switch means employed in a feedback circuit.

FIG. 9 is a block diagram of a servo circuit according to a third embodiment of the present invention.

As obvious from this diagram, the third embodiment is equipped with a switch circuit 76 which consists of a voltage output type amplifier 77 and a voltage-current converter 78 and is interposed between a calculator 74 and an integrator 75.

In FIG. 9, a process signal S55 fed to a process signal input terminal T1 is supplied to a VCA 71, and a control signal S56 fed to a control signal input terminal T2 is supplied to a first level detector 72. In the meantime, a VCA output signal S57 is delivered to an output terminal T3 while being supplied also to a second level detector 73. Such output signals S58 and S59 of the first and second level detectors 72, 73 are fed to a calculator 74. Then the calculator 74 compares the received signals S58 and S59 with each other and, in accordance with the result of such comparison, produces a signal S60 for controlling the gain of the VCA 71. For example, when the output signal S59 of the second level detector 73 is smaller than the output signal S58 of the first level detector 72, there is outputted a gain control signal S60 to increase the gain of the VCA 71.

Figure 10:
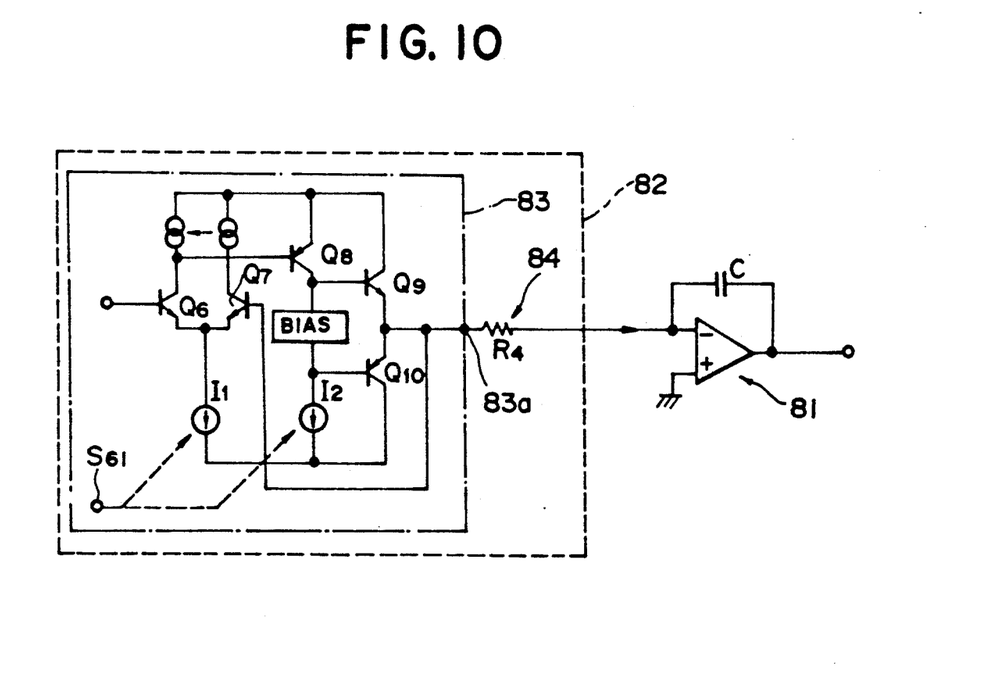
FIG. 10 is a specific circuit diagram of the switch means employed in the third and fourth embodiments of the present invention shown in FIGS. 9 and 11 respectively.

The gain control signal S60 outputted from the calculator 74 is supplied to a voltage output type amplifier 77 constituting the switch circuit 76. The amplifier 77 is provided to serve as a buffer amplifier and is turned on or off in conformity with an output state control signal S61 fed to the control input terminal. The circuit diagram of FIG. 10 represents an example of the amplifier 77. As obvious from FIG. 10, an amplifier 83 is a type generally used and, when constant current sources are controlled in a normal operating state by the output state control signal S61, currents $I_1$ and $I_2$ of predetermined values are caused to flow so that the amplifier 83 itself functions as an ordinary buffer amplifier. Therefore, the signal voltage applied to the amplifier 83 is outputted without being amplified at all, whereby the output voltage of the calculator 74 is fed without any change to an output terminal 83a of the amplifier 83. In this case, an integrator 81 is supplied with a current of the value obtained through division of the potential difference between the output terminal 83a of the amplifier 83 and the ground by the resistance of a resistor R4, and the voltage held by the integrator 81 is changed in accordance with such current value to thereby perform the servo action. Since the bipolar transistor is not employed solely to serve as an analog switch, there occurs none of the error which may otherwise be derived from incomplete insulation between the switching transistor driver and the integrator.

If the circuit is so formed that the currents $I_1$ and $I_2$ are not caused to flow by switching the output state control signal S61 fed to the constant current source, the transistor in the output stage is not supplied with a bias current and is therefore turned off, whereby the output terminal 83a of the amplifier 83 comes to have a high impedance. As a result, the impedance at one end of the resistor R4 is also rendered high so that the input current $I_i$ to the integrator 81 is reduced to zero. Thus, the voltage at the instant of reduction of the currents $I_1$ and $I_2$ of the amplifier 83 to zero is held by the integrator 81, hence maintaining the gain of the VCA 71 to the value at such instant.

The embodiment mentioned above represents the configuration of an exemplary closed-loop servo circuit where the gain of the VCA 71 is determined by the result of a comparison between the VCA output signal S57 and the control signal S56. However, the configuration may be modified to an open-loop servo circuit of FIG. 11 where a direct comparison is executed between a process signal S71 and a control signal S72.

Figure 15:
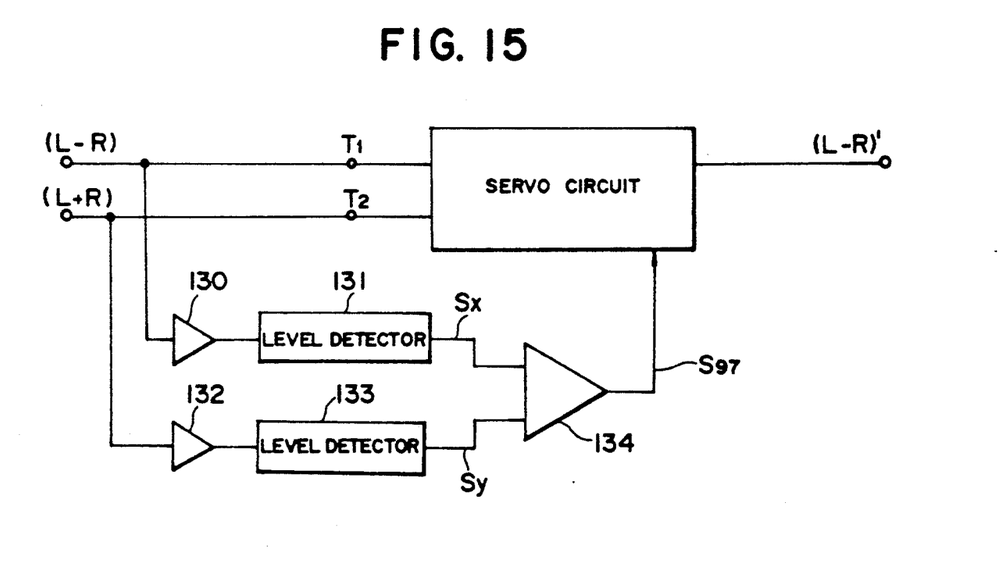
FIG. 15 is a block diagram of an exemplary circuit where the servo circuit of FIGS. 5 and 6 are used in a stereophonic matrix surround apparatus.

The servo circuit of the above configuration is adapted for use in, for example, a matrix surround circuit of a sound multiplexer as shown in a block diagram of FIG. 15. In the constitution of FIG. 15, an opposite-phase component (L−R) of a right channel signal R and a left channel signal L fed to one input terminal is supplied to a process signal input terminal T1 of the servo circuit while being supplied also to a first level detector 131 via a first buffer amplifier 130. In the meantime, an in-phase component (L+R) fed to the other input terminal is supplied to a control signal input terminal T2 of the servo circuit while being supplied also to a second level detector 133 via a second buffer amplifier 132. And respective detection outputs Sx and Sy of the first and second level detectors 131, 133 are supplied to a comparator 134 which detects the ratio of the opposite-phase component (L−R) and the in-phase component (L+R). In case the ratio thus detected is greater than a predetermined value, an output state control signal S97 for operating an amplifier of the servo circuit in a normal state is outputted from the comparator 134 to the servo circuit. Consequently the servo circuit is placed in a normal operating state wherein an output signal (L−R)' obtained through controlling the level of the opposite-phase component (L−R) by the gain conforming with the in-phase component (L+R) is delivered to an output terminal T3.

In another case where the detected ratio is smaller than a predetermined value, the comparator 134 provides an output state control signal S97 to halt the operation of the amplifier in the servo circuit. Then the impedance at the output terminal of the amplifier is rendered high to consequently block a current inflow to the integrator 95 as described. Therefore the voltage held by the integrator 95 is maintained to the value at such instant, hence preventing deterioration of the signal-to-noise ratio which may otherwise be caused by an excessive increase of the gain of the VCA 91 derived from an excessive level reduction of the opposite-phase component (L−R).

In the present invention, as described hereinabove, a voltage output type amplifier selectively switchable to either a normal operating state for directly delivering an input gain control signal to an output terminal or a signal interrupting state for retaining the output terminal at a high impedance is disposed between a signal processing circuit, which outputs the gain control signal in accordance with the level difference in levels between a process signal fed to one input terminal and a control signal fed to the other input terminal, and a voltage holding circuit for generating a control voltage in conformity with the gain control signal and for controlling the gain of the VCA whereby a current proportional to the output voltage of the amplifier is generated and supplied to the voltage holding circuit. Therefore, a desired operation performed by a FET switch circuit can be achieved similarly by the use of a bipolar-transistor switch circuit as well. Consequently, when such a servo circuit is formed into an IC configuration, it becomes possible to produce a satisfactory high-precision servo circuit merely by a bipolar manufacturing process, hence minimizing the number of required process steps to eventually curtail the production cost.

Figure 12:
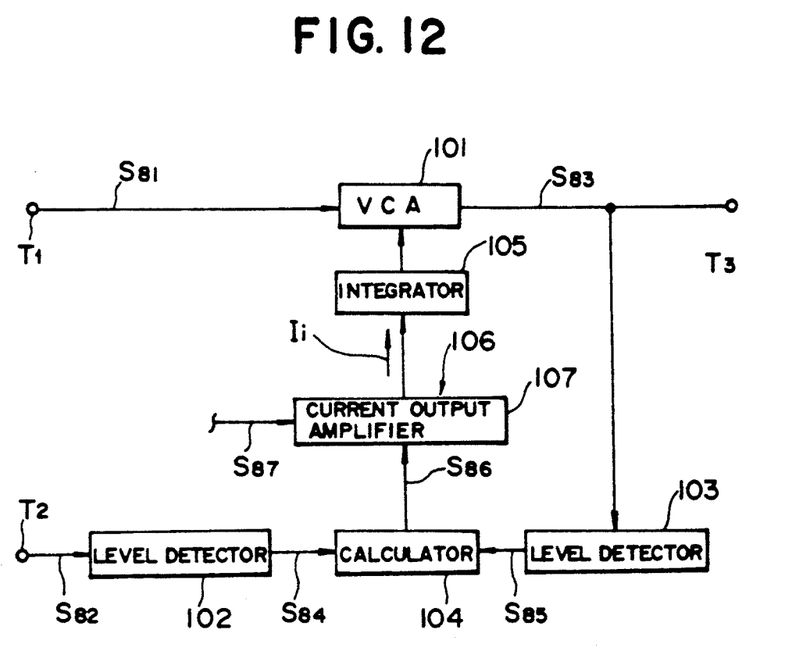
FIG. 12 is a block diagram of a fifth embodiment of the present invention representing another closed-loop servo circuit with a switch means.

FIG. 12 is a block diagram of a servo circuit according to a fifth embodiment of the present invention.

In this embodiment, as obvious from FIG. 12, a switch circuit 106 disposed between a calculator 104 and an integrator 105 is composed of a current output type amplifier 107.

In FIG. 12, a process signal S81 fed to a process signal input terminal T1 is supplied to a VCA 101, and a control signal S82 fed to a control signal input terminal T2 is supplied to a first level detector 102. In the meantime, a VCA output signal S83 is delivered as a servo output signal to an output terminal T3 while being supplied also to a second level detector 103. Also, respective output signals S84 and S85 of the first and second level detectors 102, 103 are supplied to a calculator 104. Then the calculator 104 compares the received signals S84 and S85 with each other and produces, in accordance with the result of such comparison, a signal S86 for controlling the gain of the VCA 101. For example, when the output signal S85 of the second level detector 103 is smaller than the output signal S84 of the first level detector 102, there is produced a gain control signal S86 for increasing the gain of the VCA 101 so that a servo action is performed to increase the level of the output signal S85 from the second level detector 103.

The gain control signal S86 outputted from the calculator 104 is supplied to an amplifier 107 constituting a switch circuit 106. The amplifier 107 is provided to serve as a buffer amplifier and, in this embodiment, consists of a current output type amplifier 110 as shown in a circuit diagram of FIG. 13. As obvious from this diagram, the amplifier 110 comprises a current generator 111, a controller 112 and an output selector 113.

Figure 13:
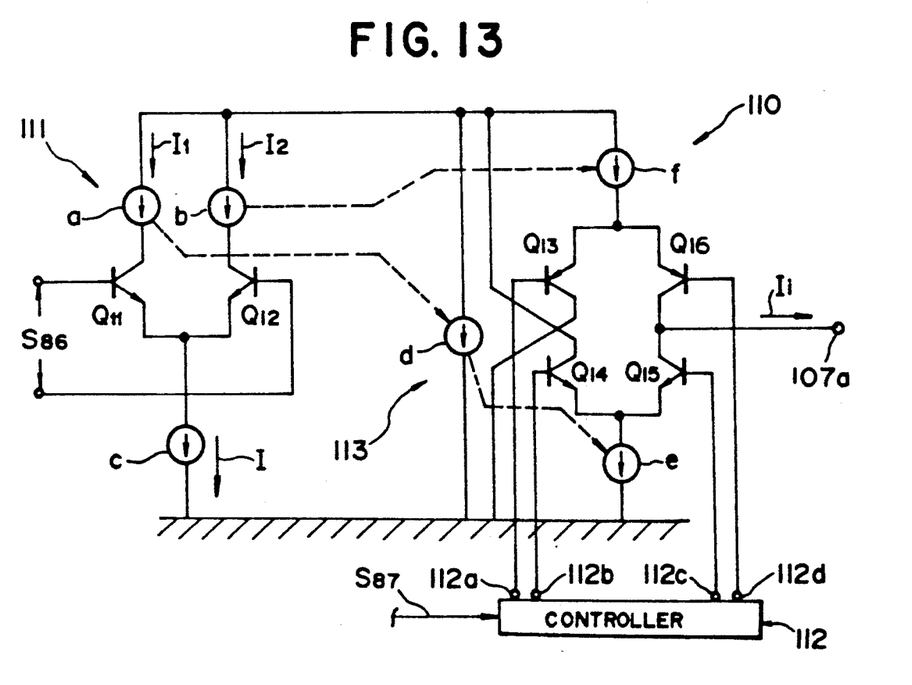
FIG. 13 is a specific circuit diagram of the switch means employed in the fifth and sixth embodiments of the present invention shown in FIGS. 12 and 14 respectively.

The current generator 111 is composed of a pair of transistors Q11, Q12 and three constant current sources a, b, c to function as a differential amplifier. A current I flowing in the constant current source c interposed between the mutually connected emitters and the ground is maintained constant, while currents $I_1$, $I_2$ flowing in the constant current sources a, b respectively are changed in accordance with the gain control signal S86 outputted from the calculator 104 and supplied to the control electrodes of the transistors Q11, Q12, whereby the currents $I_1$, $I_2$ are rendered proportionate to the gain control signal S86.

The output selector 113 is composed of four transistors Q13–Q16 and three constant current sources d, e, f wherein signals for turning on or off the transistors Q13–Q16 are supplied to the control electrodes of the individual transistors. As indicated by broken-line arrows, a mirror current from the constant current source a flows into the constant current source d, and a mirror current from the constant current source d flows into the constant current source e. Further a mirror current from the constant current source b flows into the constant current source f. Thus, each of the currents flowing into the constant current sources d, e, f in the output selector 113 is rendered proportional to the gain control signal S86. Consequently, the output selector 113 is driven under the conditions that the potentials at the output terminals 112a, 112b, 112c, and 112d of the controller 112 are turned respectively to "H" (high), "L" (low), "H", and "L" levels in conformity with the output state control signal S87 fed to the control input terminal of the controller 112, whereby a current $I_i$ proportional to the gain control signal S86 is caused to flow in the output terminal 107a.

Meanwhile, under different conditions that the potentials at the output terminals 112a, 112b, 112c, and 112d are turned to "L", "H", "L", and "H" levels respectively, the current caused to flow in the output terminal 107a is reduced to zero. Accordingly, when the controller 112 is controlled in a normal operating state by the output state control signal S87, the input current $I_i$ of a predetermined value conforming with the gain control output signal S86 is provided from the current output type amplifier 107 and then is supplied to an integrator 105. Thus, a servo action is performed as the voltage held by the integrator 105 is changed in accordance with the input current $I_i$. In this case, since the bipolar transistor is not employed solely to serve as an analog switch, there occurs none of an error which may otherwise be derived from incomplete insulation between the switching transistor driver and the integrator.

If the circuit is so formed that no current is caused to flow in the output terminal 107a by switching the output s taste control signal S87 fed to the controller 112, the input current $I_i$ to the integrator 105 is reduced to zero, and the voltage obtained upon reduction of the output current of the amplifier 107 to zero is held by the integrator 105, so that the gain of the VCA 101 is maintained to the value at such instant.

Figure 14:
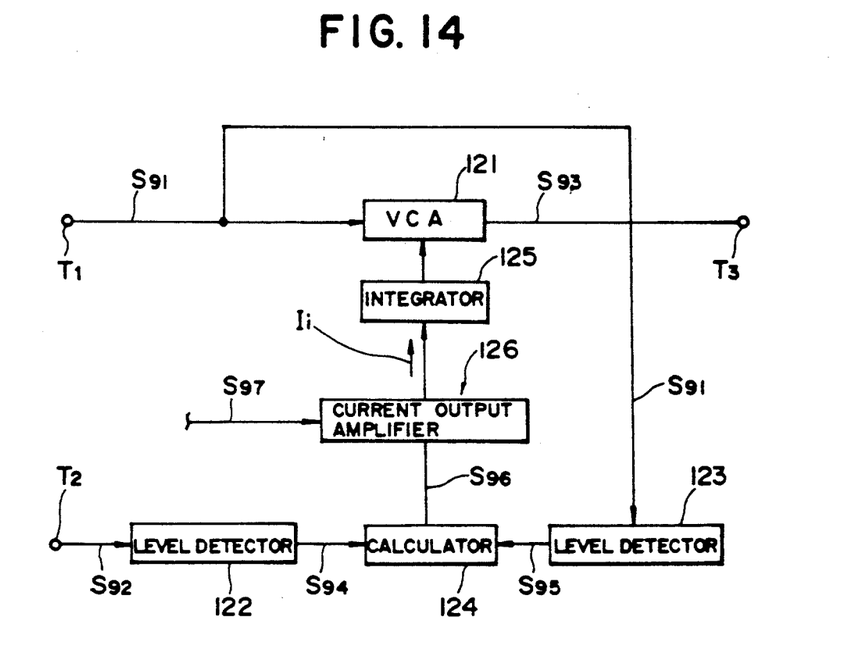
FIG. 14 is a block diagram of a sixth embodiment of the present invention representing another open-loop servo circuit with a switch means.

The fifth embodiment mentioned above represents an exemplary configuration of a closed-loop servo circuit where the gain of the VCA 101 is determined by the result of a comparison between the VCA output signal S83 and the control signal S82. However, the configuration may be modified to an open-loop servo circuit where, as shown in a block diagram of FIG. 14, a process signal S91 is compared with a control signal S92.

Figure 11:
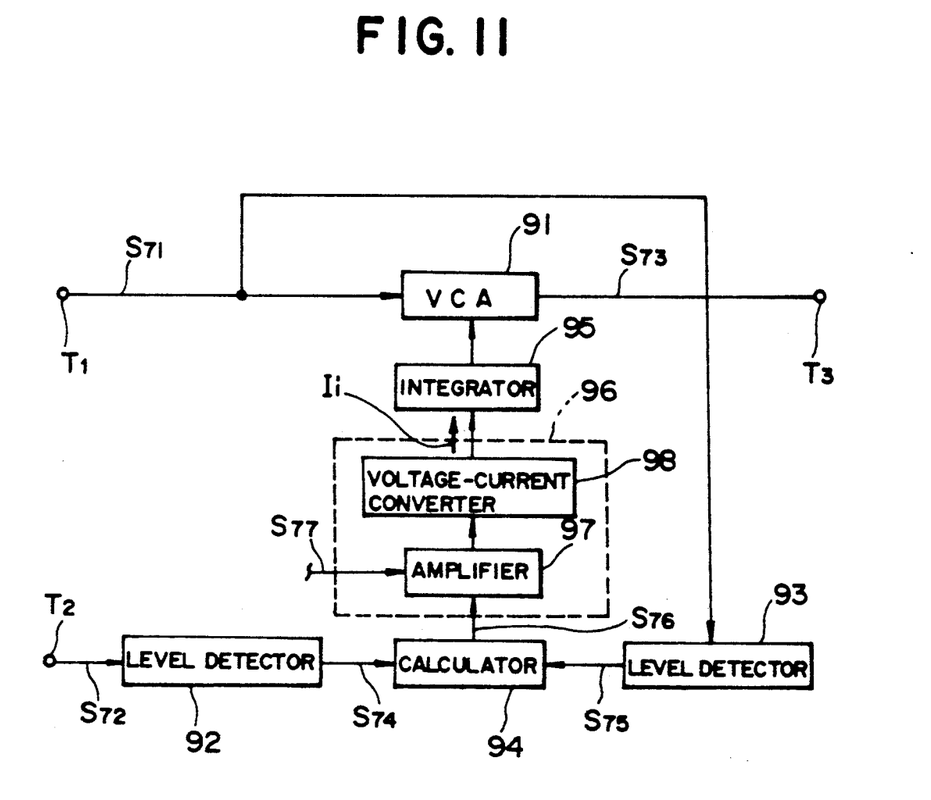
FIG. 11 is a block diagram of a fourth embodiment of the present invention representing an open-loop servo circuit with a switch means.

Similarly to the foregoing example described in connection with the embodiment of FIG. 11, the servo circuit of the above configuration according to a sixth embodiment of the invention is adapted for use in a matrix surround circuit of a sound multiplexer as shown in a block diagram of FIG. 15.

Therefore, as in the aforementioned example, a current output type amplifier selectively switchable to either a first operating state for delivering a current from an output terminal in conformity to a gain control signal obtained from a signal processing circuit or a second operating state for reducing to zero the current delivered from the output terminal is disposed between the signal processing circuit, which outputs therefrom the gain control signal in accordance with the difference in levels between a process signal fed to one input terminal and a control signal fed to the other input terminal, and a voltage holding circuit for controlling the gain of the VCA in accordance with the gain control signal, wherein the output current of the amplifier is supplied to the voltage holding circuit. Therefore, a desired operation performed by a FET switch circuit can be achieved similarly by the use of a bipolar-transistor switch circuit. Consequently, when such servo circuit is formed into an IC configuration, it becomes possible to attain a high-precision operating characteristic merely by a bipolar transistor manufacturing process, hence minimizing the number of required process steps to eventually curtail the production cost.

What is claimed is:

1. A servo circuit comprising:
a variable gain amplifier having a gain that is variable by a predetermined temperature coefficient relative to an absolute temperature for amplifying or attenuating a level of a process signal supplied thereto;
an amplitude limiter coupled to said variable gain amplifier for setting an upper limit and a lower limit of a range for the variable gain of said amplifier;
a gain control range controller coupled to said amplitude limiter for changing the upper and lower limits of the gain range in said amplitude limiter and having a temperature coefficient inverse in polarity relative to the predetermined temperature coefficient of said variable gain amplifier; and
a signal processor coupled to said amplitude limiter for detecting and calculating a level of an output signal from said variable gain amplifier supplied to one input thereof and a level of a control signal supplied to another input thereof, and for outputting a gain control signal to said amplitude limiter in accordance with a difference in levels between the signals at the inputs, so as to control the gain of said variable gain amplifier.

2. A servo circuit comprising:
a variable gain amplifier having a gain that is variable by a predetermined temperature coefficient relative to an absolute temperature;
an amplitude limiter coupled to said variable gain amplifier for setting an upper limit and a lower limit of a range for the variable gain of said variable gain amplifier;
a gain control range controller coupled to said amplitude limiter for changing the upper and lower limits of the gain range in said amplitude limiter and having a temperature coefficient inverse in polarity relative to the predetermined temperature coefficient of said amplifier; and
a signal processor coupled to said amplitude limiter for detecting and calculating a level of a process signal supplied to one input thereof and a level of a control signal supplied to another input thereof, and for outputting a gain control signal to said amplitude limiter in accordance with a difference in levels between the control signal and the process signal to control the gain of said variable gain amplifier.

3. A servo circuit comprising:
a signal processor for detecting and calculating levels of an output signal from a variable gain control amplifier supplied to one input thereof and a level of a control signal supplied to another input thereof, and for outputting a gain control signal in accordance with a difference in levels between the signals at the inputs;
a voltage output type amplifier selectively switchable to either a normal operating state for directly delivering to an output thereof the gain control signal obtained from said signal processor, or a signal interrupting state for maintaining said output at a high impedance;
an amplifier output converter for converting an output voltage of said voltage output type amplifier into a current;
a voltage holding means for generating an output voltage proportional to the current supplied thereto from said amplifier output converter; and
said variable gain control amplifier having a gain controlled by the output voltage from said voltage holding means for amplifying, in accordance with a level of said output voltage from said voltage holding means, a process signal supplied thereto.

4. A servo circuit according to claim 3, wherein said voltage holding means comprises an integrator.

5. A servo circuit comprising:
a signal processor for detecting and calculating a level of a process signal supplied to one input thereof and a level of a control signal supplied to another input thereof, and for outputting a gain control signal in accordance with a difference in levels between the signals at the inputs;
a voltage output type amplifier selectively switchable to either a normal operating state for directly delivering to an output thereof the gain control signal obtained from said signal processor, or a signal interrupting state for maintaining said output at a high impedance;
an amplifier output converter for converting an output voltage of said voltage output type amplifier into a current;
a voltage holding means for generating an output voltage proportional to the current supplied thereto from said amplifier output converter; and
a variable gain amplifier having a gain controlled by the output voltage from said voltage holding means for amplifying, in accordance with a level of said output voltage from said voltage holding means, a process signal supplied thereto.

6. A servo circuit according to claim 5, wherein said voltage holding means comprises an integrator.

7. A servo circuit comprising:

a signal processor for detecting and calculating a level of an output signal from a variable gain control amplifier supplied to one input thereof and a level of a control signal supplied to another input thereof, and for outputting a gain control signal in accordance with a difference in levels between the signals at the inputs;

a current output type amplifier for producing an output current of a value corresponding to the gain control signal outputted from said signal processor, and for selectively supplying the output current from an output or for interrupting such output current;

a voltage holding means for generating an output voltage proportional to the current supplied thereto from said current output type amplifier; and said variable gain amplifier having a gain controlled by the output voltage from said voltage holding means for amplifying, in accordance with a level of said output voltage from said voltage holding means, a process signal supplied thereto.

8. A servo circuit according to claim 7, wherein said voltage means comprises an integrator.

9. A servo circuit comprising:

a signal processor for detecting and calculating a level of a process signal supplied to one input thereof and a level of a control signal supplied to another input thereof, and for outputting a gain control signal in accordance with a difference in levels between the control and process signals;

a current output type amplifier for producing an output current of a value corresponding to the gain control signal outputted from said signal processor, and for selectively supplying the output current from an output or for interrupting such output current;

a voltage holding means for generating an output voltage proportional to the current supplied thereto from said current output type amplifier; and a variable gain amplifier having a gain controlled by the output voltage from said voltage holding means for amplifying, in accordance with a level of said output voltage from said voltage holding means, the process signal supplied thereto.

10. A servo circuit according to claim 9, wherein said voltage holding means comprises an integrator.

* * * * *